(12) United States Patent
Karstens

(10) Patent No.: US 7,551,457 B2
(45) Date of Patent: Jun. 23, 2009

(54) APPARATUS FOR INSERTING AND EJECTING AN ELECTRONIC ENCLOSURE WITHIN A CABINET

(75) Inventor: Christopher Kent Karstens, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 165 days.

(21) Appl. No.: 11/778,017

(22) Filed: Jul. 14, 2007

(65) Prior Publication Data

US 2008/0013287 A1 Jan. 17, 2008

Related U.S. Application Data

(62) Division of application No. 10/909,496, filed on Aug. 2, 2004, now Pat. No. 7,317,619.

(51) Int. Cl.
*H05K 7/14* (2006.01)
(52) U.S. Cl. ...................................... 361/801
(58) Field of Classification Search ................. 361/801
See application file for complete search history.

(56) References Cited

U.S. PATENT DOCUMENTS

| 4,995,821 A | 2/1991 | Casey |
| 5,173,845 A | 12/1992 | Shaw |
| 5,398,164 A * | 3/1995 | Goodman et al. ........... 361/752 |
| 5,426,567 A | 6/1995 | Opeka |
| 2003/0030993 A1 | 2/2003 | Kitchen et al. |
| 2003/0101304 A1 | 5/2003 | King et al. |

OTHER PUBLICATIONS

IBM E-Server BladeCenter Solutions, published Jul. 2004, http://www-1.ibm.com/servers/eserver/bladecenter.html.

* cited by examiner

*Primary Examiner*—Dean A. Reichard
*Assistant Examiner*—Abiy Getachew
(74) *Attorney, Agent, or Firm*—Ronald V. Davidge; Steven L. Bennett

(57) ABSTRACT

A cabinet includes spaces for a number of electronic enclosures, each of which has a free end from which a pair of levers extend upward and downward to teeth engaging slots within the cabinet, aiding in the insertion and removal of the enclosures from the cabinet. An electronic enclosure that is wider than a standard width includes additional teeth on crank plates turning with the levers. The electronic enclosure may include an electrically-operated interlock mechanism preventing the insertion or removal of the electronic enclosure by preventing movement of a shaft attached to either or both of the levers.

22 Claims, 5 Drawing Sheets

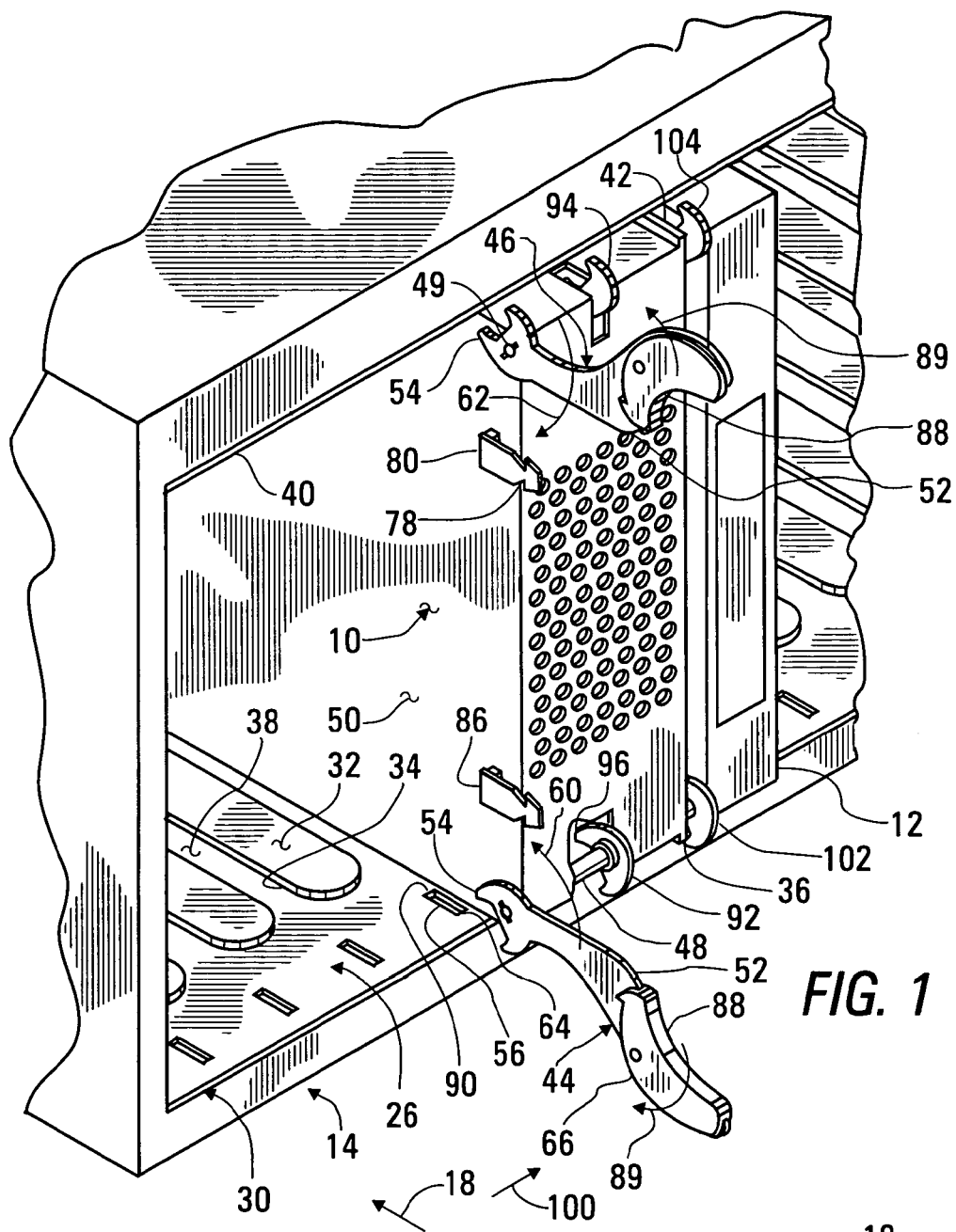
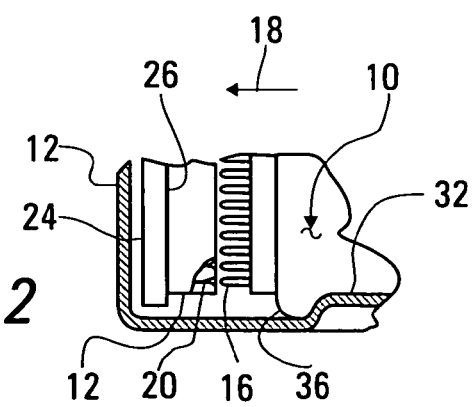
FIG. 1
FIG. 2

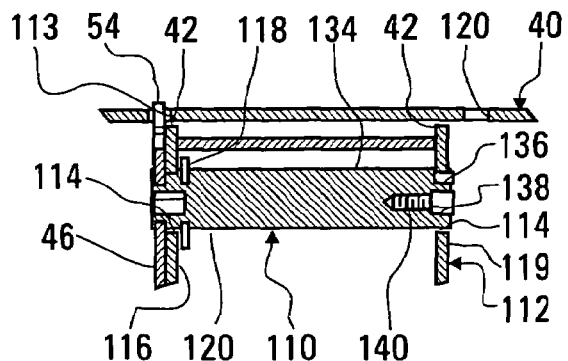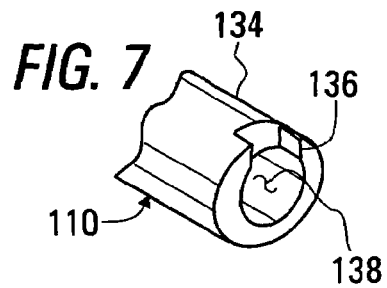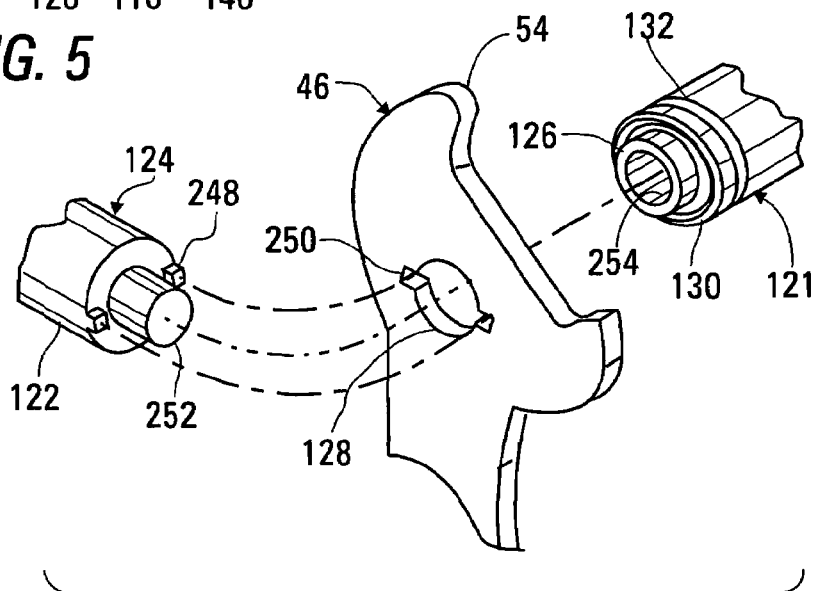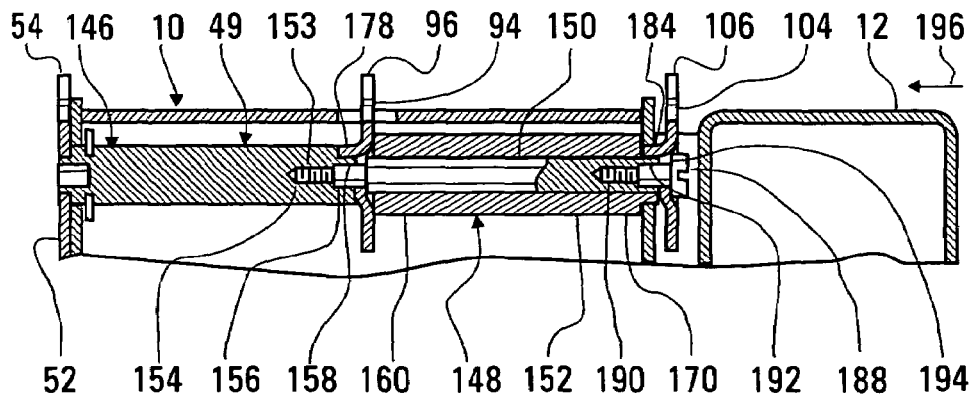

APPARATUS FOR INSERTING AND EJECTING AN ELECTRONIC ENCLOSURE WITHIN A CABINET

CROSS-REFERENCE TO A RELATED APPLICATION

This application is a division of a U.S. patent application Ser. No. 10/909,496, which was filed Aug. 02, 2004 now U.S. Pat. No. 7,317,619.

BACKGROUND OF THE INVENTION

1. Field of the Invention

This invention relates to apparatus for inserting and ejecting an electronic enclosure within a cabinet, and, more particularly, to providing forces with such apparatus for the engagement and disengagement of electrical terminals despite variations in the width of the electronic enclosure.

2. Summary of the Background Art

A number of multiple computer installations, such as installations in which a number of servers are connected with one another and with communications lines, individual computer systems are installed within individual electronic enclosures mounted in individual positions, or "slots," within a cabinet. Such computer systems are configured as "blades" to fit within the cabinet, with each of the individual enclosures being substantially higher than it is wide, and with electrical connections with the individual systems including an array of contact terminals extending from the rear of each individual enclosure. Each such electronic enclosure is inserted into a slot within the cabinet from the front. Since a large number of electrical connections are made when the enclosure is fully inserted, an insertion/ejection mechanism is configured to provide a mechanical advantage helping to move the enclosure with these terminals to engage contacts within the cabinet, i.e. during an end portion of the process of inserting the enclosure within the slot and during a beginning portion of the process of ejecting the enclosure from the slot.

For example, in the IBM BladeCenter™, each of the electronic enclosures is provided with an upper lever pivotally mounted on its left side near its upper front corner and with a lower lever pivotally mounted on the left side near its lower front corner. The upper lever includes a tooth extending upward within a slot in an upper panel extending above the enclosure when the enclosure is fully inserted within the cabinet. Similarly, the lower lever includes a tooth extending downward within a slot in a lower panel extending below the enclosure when the enclosure is fully inserted within the cabinet. Before the electronic enclosure can be fully inserted within the cabinet, both the upper lever and the lower lever must be pivoted into an open position, with the teeth of the levers extending inward, out of contact with the upper and lower panels, and with handle portions of the levers extending outward. Then the process of inserting the enclosure into the cabinet is completed by pivoting the levers into their closed position, with the teeth of the levers engaging adjacent edges of the slots in the panels to pull the enclosure inward against the forces developed to establish electrical connections by engaging contact springs with multiple terminals. When the electronic enclosure is to be removed from the cabinet, this procedure is reversed, with the upper and lower levers being pivoted into the open position so that the teeth of these levers engage edges of the slots to eject the enclosure outwardly as the various terminals are disconnected from the contact springs.

Within the upper and lower panels, the slots are uniformly spaced apart to provide for filling the cabinet with a number of electronic enclosures, each having a common, minimum width. For each of the electronic enclosures, the upper and lower levers operate, respectively, in a pair of slots that are vertically aligned along the left side of the enclosure. While this arrangement is satisfactory for electronic enclosures having the common, minimum width, it does not work well with larger enclosures having a multiple of the common, minimum width. Since such wider enclosures typically have contact terminal patterns extending across a width greater than the common, minimum width, the use of such an arrangement of levers to install and eject the wider enclosure can result in difficulties caused by twisting the enclosure along guide surfaces of the cabinet and contact surfaces during insertion and injection, with the forces generated by the movement of the lever teeth within the slots in the upper and lower panels. Thus, what is needed is an insertion and ejection mechanism applying forces at two or more locations along the width of a wider enclosure.

Furthermore, the width of an individual electronic enclosure can be increased by adding one or more expansion units, fastened to either side, or both sides, of the enclosure. For example, an expansion unit may include additional hard disk drives to provide increased storage capacity. Therefore, what is additionally needed is a method for adding a mechanism to apply additional insertion and ejection forces when an expansion unit is added to an electronic enclosure.

U.S. Pat. App. Pub. Nos. 2003/0101304 and 2003/0030993 describe a blade server having an ejector mechanism including a pivotable handle. In particular, the '304 publication describes the blade server as being configured as a field replaceable unit removably receivable in a carrier of a modular computer system, such as a high-density blade server system. The blade server is provided with an enclosure and can be provided with a plurality of processors within the enclosure, which may be larger than a standard enclosure for a blade server having a single processor. The carrier can be configured to receive such an oversized blade server enclosure as well as a standard enclosure. The '993 publication particularly describes the ejector mechanism, which can possibly also act as an injection mechanism, as being located at the elongate front face of the blade server and as including an elongate lever extending substantially along the elongate front face. A pivotal mounting for the lever is located toward a first end thereof, and an ejection protrusion is also provided at the first end. In a blade server having a greater width than a conventional blade server, the lever and ejector mechanism are shown as extending across only the portion of the width of the blade server corresponding to the width of a conventional blade server. Thus, the number of contact surfaces for insertion and ejection is not increased when the width of the blade server is increased, and the distance between contact surfaces is likewise not increased. What is needed is an arrangement providing additional contact surfaces for insertion and ejection when the width of an individual blade is increased and for providing an increased distance between such contact surfaces in the direction of increased blade width.

U.S. Pat. No. 5,173,845 describes a frontplane structure for use with a number of parallel printed circuit boards having respective sets of a plurality of electrical connectors mounted to their front edges. The frontplane structure includes a multilayer printed circuit board mounted to a sheet metal sub-chassis that includes integral injector/ejector devices which, by means of a cam action, produce a reduction in the mechanical effort required to mate the frontplane with each of the connectors contained on the number of printed circuit board assemblies installed into a card cage assembly or computer chassis to which the frontplane is to be connected. A plurality of high-density printed circuit connectors are mounted to the multi-layer printed circuit board for interconnecting with the sets of connectors mounted to the front edge of the printed circuit board assemblies. What is needed is an arrangement providing a number of contact surfaces for the insertion and ejection of individual electronic modules without removing a frontally disposed structure from all of the modules.

U.S. Pat. No. 4,995,821 describes a system for latching a plurality of connector modules or multimodule units in an array to a panel, with the system including opposing parallel assemblies mounted to the panel, each having a plurality of cam levers in associated opposing pairs at each module site. The cam levers are mounted along respective shafts of the assemblies, being adapted to be reciprocally rotatable about the outwardly from and inwardly toward the array. Each cam lever includes a recess into which a latching projection of a module is receivable upon module insertion into the array. When the cam lever is rotated inwardly, the recess urges the module into a fully mated position in its receptacle connector. When the cam lever is rotated outwardly, the recess raises the projection, ejecting the module from the receptacle connector. Several cam levers can be ganged together by means of a pin extending through holes in the cam levers near an end opposite the end at which the cam levers are pivoted, to be rotatable outwardly as a unit, corresponding to several modules ganged as a unit. What is needed is a method for varying the arrangement of cam levers pivotally mounted on individual modules to compensate for dimensional variations among the various modules. Furthermore, while U.S. Pat. Nos. 5,173,845 and 4,995,821 describe methods for ganging cam levers together with shafts or pins extending through an end of the levers opposite the end at which they are pivotally mounted, what is needed is a method for simply extending a pivot shaft arrangement to gang such levers together.

U.S. Pat. No. 5,426,567 describes a structure including similar electronic module packages having guide pins and front actuated retaining rods for mounting the packages on a mounting panel having threaded mounting holes spaced in a regular pattern to accept the guide pins and retaining rods of several module packages. The guide pins and retaining rods are mounted on diagonally opposite corners of the modules. Various arrangements of modules on the mounting panel are allowed by suitable arrangement of the pattern of mounting holes in the panel. While the retaining rods fasten modules of varying size to the panel, forces to engage and disengage connector terminals during the installation and removal of the modules are not provided by the retaining rods.

SUMMARY OF THE INVENTION

In accordance with one aspect of the invention, apparatus is provided including an electronic enclosure, a first lever, and a first pivot shaft. The electronic enclosure has a latching side and a free side, opposite the latching side. The first lever is pivotally mounted to be disposed along the latching side and to be movable between an open position and a closed position. The first lever includes a first tooth moving outward from the electronic enclosure and forward along the electronic enclosure as the first lever is moved from the open position to the closed position. The first pivot shaft extends between the first lever and the free side, being attached to the first lever to pivot with the first lever. The first pivot shaft includes a first outer coupling surface including an angular positioning element, exposed at the free side and disposed at a first predetermined angle with respect to the first tooth.

The coupling surface including an angular positioning element provides an ability to mount a shaft or a latching plate on the end of the first pivot shaft so that features of the shaft or latching plate will turn with the shaft, remaining in a particular alignment with features of the first lever, such as the first tooth. The apparatus may additionally include an expansion unit attached to extend outward from the free side of the electronic enclosure and an outer end crank plate, including an inner coupling surface including an angular positioning element, removably attached to the first pivot shaft to be disposed along the free side of the electronic enclosure and to pivot with the first lever. The outer end crank plate includes a tooth aligned with the first tooth.

Furthermore, the apparatus may include an intermediate crank plate mounted on the first pivot shaft including a tooth outwardly exposed from the electronic enclosure in alignment with the first tooth of the first lever. Such an intermediate crank plate is disposed between the latching side and the free side of the electronic enclosure.

The apparatus may additionally include an interlocking mechanism electrically operated to selectively block pivoting movement of the first pivot shaft from the closed position to the open position.

In accordance with another aspect of the invention, electronic apparatus is provided including a cabinet and first and second electronic enclosures. The cabinet includes a first panel having a plurality of slots extending in a line, spaced apart with a first distance between adjacent slots, and a guiding structure associated with each of the slots. The first electronic enclosure includes a latching side, a free side opposite the latching side, and a first lever, disposed at the latching side, including a first tooth engaging a first slot within the plurality of slots in the first panel. The first electronic enclosure is disposed between the first slot in the first panel and a second slot in the first panel, adjacent the first slot in the first panel and outside a space adjacent the second slot in the first panel. The second electronic enclosure includes a latching side, an opposite side opposite the latching side, a second lever, disposed at the latching side, including a second tooth, engaging a third slot within the plurality of slots in the first panel, and a first crank plate, including a third tooth, engaging a fourth slot within the plurality of slots in the first panel, and a first pivot shaft connecting the second lever and the first crank plate to turn together with the second and third teeth aligned with one another, wherein the second and third teeth move forward along the second electronic enclosure and into the third and fourth slots within the plurality of slots as the first pivot shaft is moved from an open position to a closed position.

BRIEF DESCRIPTION OF THE FIGURES

FIG. 1 is a fragmentary perspective view of an electronic enclosure, built in accordance with the invention, partly inserted within a cabinet together with an expansion unit;

FIG. 2 is a fragmentary cross-sectional elevation of the cabinet of FIG. 1, with the electronic enclosure of thereof partly inserted therein;

FIG. 5 is a longitudinal cross-sectional elevation of an upper pivot shaft built in accordance with the invention within in an electronic enclosure having a standard width;

FIG. 6 is a perspective view of a left end of the upper pivot shaft of FIG. 5 in an exploded relationship with an upper lever attached thereto and with a right end of an extension shaft attachable thereto;

FIG. 7 is a perspective view of a right end of the upper pivot shaft of FIG. 5;

FIG. 8 is a longitudinal cross-sectional elevation of an upper pivot shaft built in accordance with the invention within an electronic enclosure of FIGS. 1 and 3;

DETAILED DESCRIPTION OF THE INVENTION

Figures 3, 4:
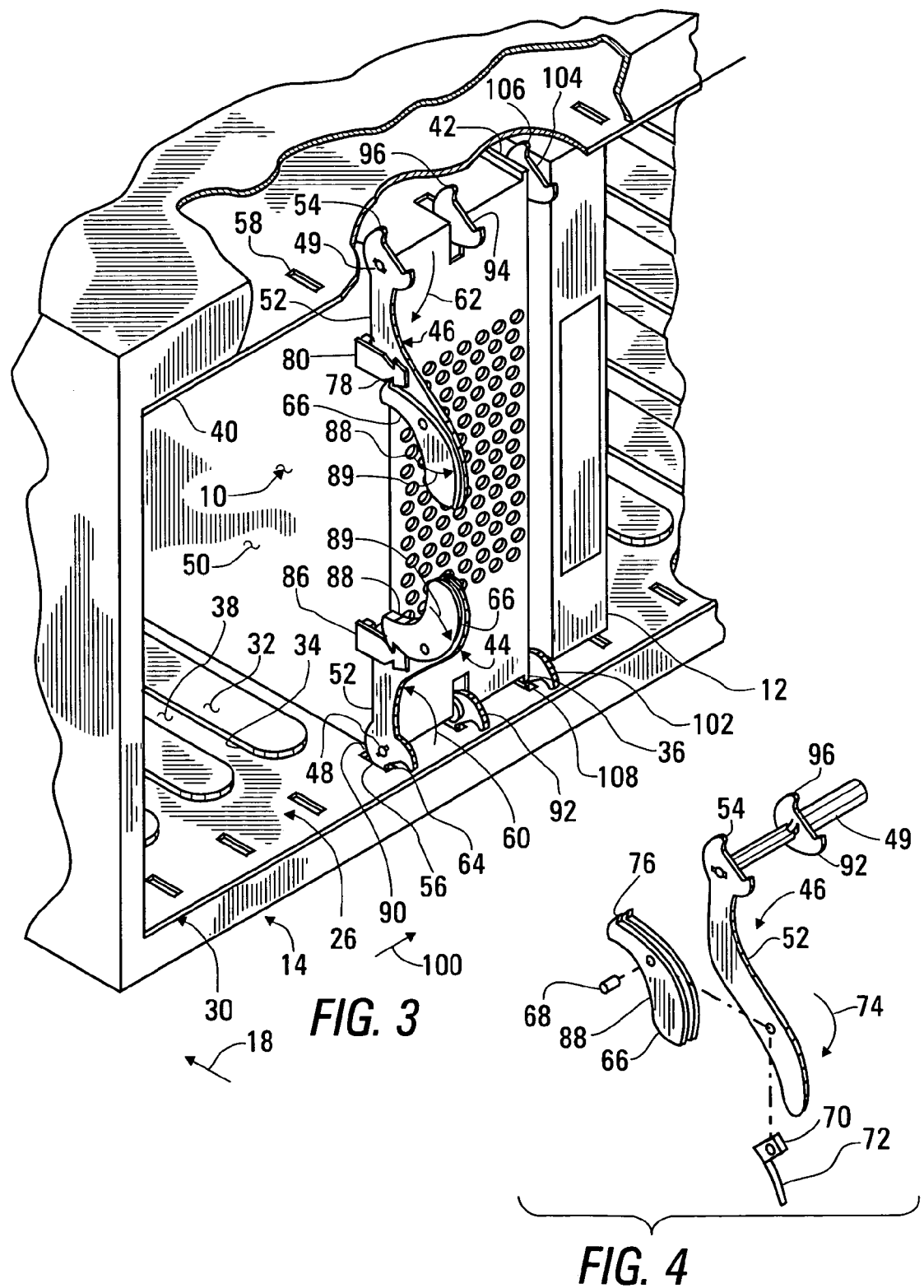
FIG. 3 is a fragmentary perspective view of the electronic enclosure and extension unit of FIG. 1, fully inserted within the cabinet thereof.
FIG. 4 is a perspective view of an upper lever of the electronic enclosure of FIG. 1, showing elements thereof in an exploded relationship with one another.

FIG. 1 is a fragmentary perspective view of an electronic enclosure 10 built in accordance with the invention, together with an expansion unit 12, which are together partly inserted within a cabinet 14. For example, the electronic enclosure 10 includes a computer system configured as a blade server, while the expansion unit 12 includes a number of hard disk drive units providing additional storage to be used by the blade server. The electronic enclosure 10 and the expansion unit 12 are physically attached to one another, and are removed from and installed within the cabinet 14 as a unit.

FIG. 2 is a fragmentary cross-sectional elevation of the cabinet 14, with the electronic enclosure 10 partly inserted therein, showing a lower rear portion of the enclosure 10. The enclosure 10 includes a number of contact terminals 16, extending rearward, in the direction of arrow 18 to make electrical contact with contact springs 20 within connectors 22 of the cabinet 14. For example, the connectors 22 are attached to a circuit board 24 extending along an internal rear surface 26 of the cavity 26 provided within the cabinet 14 for receiving electronic enclosures.

The cabinet 14 includes a lower panel 30 having a number of raised structures 32 providing lateral guiding surfaces 34 guiding the electronic enclosure 10 as it is inserted into the cabinet 14 in the rearward direction of arrow 18 and as it is subsequently withdrawn from the cabinet 14 opposite the direction of arrow 18. The electronic enclosure 10 includes a pair of downwardly directed edge rails 36 sliding in grooves 38 between adjacent raised structures 32. The cabinet 14 additionally includes an upper panel 40, having features similar to the lower panel 30, with upwardly-directed edge rails 42 of the electronic enclosure 10 sliding along grooves between depressed structures (not shown) in the upper panel 40.

The electronic enclosure 10 additionally includes an insertion/ejection mechanism having a lower lever 44 and an upper lever 46. The lower lever 44 is pivotally mounted by means of a pivot shaft 48 near a lower front corner of a latching side 50, which is, for example, the left side of the electronic enclosure 10. The upper lever 46 is pivotally mounted by means of a pivot shaft 49 near an upper front corner of the latching side 50. Each of the levers 44, 46 includes a handle portion 52 and a slot-engaging tooth 54. Before the electronic enclosure 10 can be fully inserted within the cabinet 14, the levers 44, 46 must be pivoted so that their handles 52 extend forward, opposite the direction of arrow 18, allowing the slot-engaging teeth 54 to be moved into place adjacent slots within the panels 30, 40.

FIG. 3 is a fragmentary perspective view of the electronic enclosure 10 with the expansion unit 12, as fully inserted within the cabinet 14, to be held in place by the slot-engaging tooth 54 of the lower lever 46 extending within a slot 56 of the lower panel 30 and by the slot-engaging tooth 54 of the upper lever 46 extending within a slot 58 of the upper panel 40. The electronic enclosure 10 is moved from the partially inserted position of FIG. 1 to the fully inserted position of FIG. 3 by pivoting the handle 52 of the lower lever 44 upward, in the direction indicated by arrow 60, and by simultaneously pivoting the handle 52 of the upper lever 46 downward, in the direction of arrow 62. During this pivoting motion, the slot-engaging tooth 58 of each of the levers enters an adjacent slot 56, 58 and, engaging a front edge 64 of the slot 56, 58 pushes against the edge 64 to move the electronic enclosure 10 rearward, in the direction of arrow 18 as the contact terminals 16 are moved in engagement with the contact springs 20 (shown in FIG. 2).

The cabinet 14 is configured to accept a number of conventional electronic enclosures (not shown), each of which includes a latching side, having lower and upper levers similar to levers 44, 46, and a free side, opposite the latching side, that does not include such levers. Thus, adjacent slots 58 within the lower panel 30 and the upper panel 40 are spaced apart through a distance allowing such conventional electronic enclosures (not shown) to be inserted along guiding surfaces 34 with teeth of the levers extending within the slots 58.

FIG. 4 is an exploded view of the upper lever 46, which includes a latching member 66 pivotally mounted on the handle portion 52 by a pin 68, together with a latching spring 70 having a cantilever tab 72 applying a torque in the direction of arrow 74 to the latching member 66, so that a tooth 76 of the latching member 66 is held within a notch 78 of a latching bracket 80 when the upper lever 46 is held in the closed position of FIG. 3. The lower lever 46 includes a similar arrangement, with a tooth 82 of a latching member 84 being held in a notch of a second latching bracket 86. In this way, the lower lever 44 and the upper lever 46 form a structure holding the electronic enclosure 10 in place within the cabinet 14 after it is fully inserted therein.

When the electronic enclosure 10 is to be removed from the cabinet 14, the handle portions 52 of the lower lever 44 and the upper lever 46 are grasped to be moved outward, opposite the direction of arrows 60, 62. The latching members 66, 84 each have a curved surface 88 extending along inner surfaces of the handle portions 52, so that, as the levers 44, 46 are gripped to be moved outward, the latching portions 66, 84 are pivoted in the directions of arrows 89, releasing the teeth 76, 82 of the latching members 66, 84 from the notches within the latching brackets 80, 86, allowing rotation of the levers 44, 46 opposite the direction of arrows 60, 62. This rotation of the levers 44, 46 causes the teeth 54 of the levers 44, 46 to slide in contact with the rear edges 90 of the associated slots 56, 58, ejecting the electronic enclosure outward, opposite the direction of arrow 18, through a short distance, disengaging the contact terminals 16 from the contact springs 20.

The guiding structures 32 and slots 56, 58 of the cabinet 14 are spaced to allow the cabinet 14 to be filled with electronic enclosures each having a standard width, with the teeth 54 of the levers 44, 46 of adjacent enclosures fitting within adjacent slots 56, 58. The cabinet 14 additionally accepts electronic enclosures, such as the electronic enclosure 10, having a width equal to a multiple of the standard widths.

In accordance with a first version of the invention, such an enclosure 10 includes a lower crank plate 92, connected by the lower pivot shaft 48 to turn with the lower lever 44 and an upper crank plate 94, connected by the upper pivot shaft 49 to turn with the upper lever 46. The lower crank plate 94 includes a tooth 96 aligned with the tooth 54 of the lower lever 44. As the lower lever 44 is rotated in the direction of arrow 60 into the closed position of FIG. 2, the tooth 96 engages a slot 98 in the lower panel 30 adjacent the slot 56, pulling the enclosure 10 inward, in the direction of arrow 18. Similarly, the upper crank plate 94 has a tooth 96 aligned with the tooth 54 of the upper lever 56, connected to the upper pivot shaft 49, which engages a slot (not shown) in the upper panel 40 to pull the enclosure 10 inward as the upper lever 46 is pivoted in the direction of arrow 62. This arrangement spreads the application of insertion forces, acting in the direction of arrow 18, along the width of the enclosure 10, in the direction of arrow 100, reducing a tendency of the enclosure 10 to twist and drag along the guiding surfaces 34 as it is inserted, in opposition to forces acting on contact terminals 16 extending across the width of the enclosure 10.

Similarly, as the levers 44, 46 are rotated out of the closed position of FIG. 3, opposite the directions of arrows 60, 62, respectively, the movement of the teeth 96 within slots in the panels 30, 40 provide forces acting on the enclosure 10 opposite the direction of arrow 18, aiding in the ejection of the enclosure 10 without substantial twisting and dragging along the guiding surfaces 34 as the contact terminals 16 are pulled away from the contact springs 20.

In accordance with a second version of the invention, the lower pivot shaft 48 is provided with means for attaching a lower end crank plate 102 including a tooth (not shown) additionally aligned with the tooth 54 of the lower lever 44. The upper pivot shaft 49 is similarly provided with means for attaching an upper end crank plate 104 having a tooth 106 additionally aligned with the tooth 54 of the upper lever 44. As the lower lever 44 is rotated in the direction of arrow 60 into the closed position of FIG. 2, the tooth of the lower end crank plate 102 engages a slot 108 in the lower panel 30, pulling the enclosure 10 inward, in the direction of arrow 18. Similarly, the tooth 96 engages a slot (not shown) in the upper panel 40 to pull the enclosure 10 inward as the upper lever 46 is pivoted in the direction of arrow 62. This arrangement further spreads the application of insertion forces, acting in the direction of arrow 18, along the width of the enclosure 10, in the direction of arrow 100, reducing a tendency of the enclosure 10 to twist and drag along the guiding surfaces 34 as it is inserted, in opposition to forces acting on contact terminals 16 extending across the width of the expansion unit 12, as well as across the width of the enclosure 10.

Similarly, as the levers 44, 46 are rotated out of the closed position of FIG. 3, opposite the directions of arrows 60, 62, respectively, the movement of the teeth of end crank plates 102, 104 within slots in the panels 30, 40 provide forces acting on the enclosure 10 opposite the direction of arrow 18, aiding in the ejection of the enclosure 10 without substantial twisting and dragging along the guiding surfaces 34 as the contact terminals 16 are pulled away from the contact springs 20.

An upper pivot shaft built in accordance with the invention to be held within an electronic enclosure having a standard width, corresponding to the distance between adjacent slots 56 in the lower panel 30 and between adjacent slots 58 in the upper panel 40, will now be discussed with reference to FIGS. 5-7. Features identical or similar to the features previously discussed with reference to FIGS. 1-4 are accorded like reference numbers.

FIG. 5 is a fragmentary cross-sectional elevation of the upper pivot shaft 110 within such a standard-width electronic enclosure 112, which includes upwardly directed rails 42 for guidance into a position within the cabinet 14. The electronic enclosure 112 is shown as installed within the cabinet 14, with the tooth 54 of the lever 46 engaging a slot 113, among the slots 58 of the upper panel 40. The enclosure 112 also includes a pair of holes 114, aligned with one another, in which the upper pivot shaft 110 is held. The upper lever 46 is attached to the upper pivot shaft 110 to extend downward along a latching side 116 of the enclosure 112. In the example of FIG. 5, the upper pivot shaft 110 is pivotally attached to be removed and installed with the latching side 116, being held thereto by a snap-on retaining ring 118. The electronic enclosure 112 additionally includes a free side 119, opposite the latching side 116, without a mechanism for insertion and injection, such as the upper lever 46. As an example of a standard-width enclosure, the electronic enclosure 112 occupies an area between the slot 113 and a second slot 120 adjacent this slot 58 but beyond the free side 119, with the electronic enclosure 112 being spaced away from this second slot 120 so that another electronic enclosure may be placed adjacent the enclosure 112 with the lever 46 of the other electronic enclosure engaging the slot 120.

FIG. 6 is a perspective view of a left end 121 of the upper pivot shaft 110 in an exploded relationship with the upper lever 46, and additionally with a right end 122 of an upper left extension shaft 124, optionally attached as a part of an expansion unit extending from the latching side of an electronic enclosure. For example, the upper pivot shaft 110 is attached to the upper lever 56 with an end stud 126 of the shaft 110 extending within a hole 128 in the upper lever 56 by projection welding a ring shaped projection 130 on the shaft 110 to an adjacent surface of the upper lever 56. The left end 121 of the shaft 110 also includes a groove 132 for accepting the retaining ring 118.

FIG. 7 is a perspective view of a right end 134 of the upper pivot shaft 110, showing a notch 136 used, for example, to align the end upper crank plate 104, discussed above in reference to FIG. 3, so that its tooth 106 is in alignment with the tooth 54 of the upper lever 46. The right end 134 of the shaft 110 additionally includes an alignment hole 138 and a threaded hole 140, which are used, for example, for the attachment of the end upper crank plate 104. Thus, the right end 134 of the shaft 110 forms a coupling surface including an angular positioning element in the form of the notch 136, which is used to angularly position a shaft or plate attached to the shaft end 134 with respect to other features of the shaft.

The upper pivot shaft 49, previously described in reference to FIGS. 1-4, used within the electronic enclosure 10, which has a width equal to twice the standard width, will now be described with additional references being made to FIGS. 8-10.

FIG. 8 is a longitudinal cross-sectional elevation of the upper pivot shaft 49, within the electronic enclosure 10. The upper pivot shaft 49 includes a first section 146, which is preferably identical to the shaft 110 used, as described above in reference to FIGS. 5-7, in an electronic enclosure 112. The upper pivot shaft 49 additionally includes a second section 148 including a core pin 150 and a sleeve 152. The core pin 150 includes a threaded portion 153, engaging a threaded hole 154 within the first section 146, and a cylindrical alignment portion 156 engaging an alignment hole 158 within the first section 146.

Figure 9:
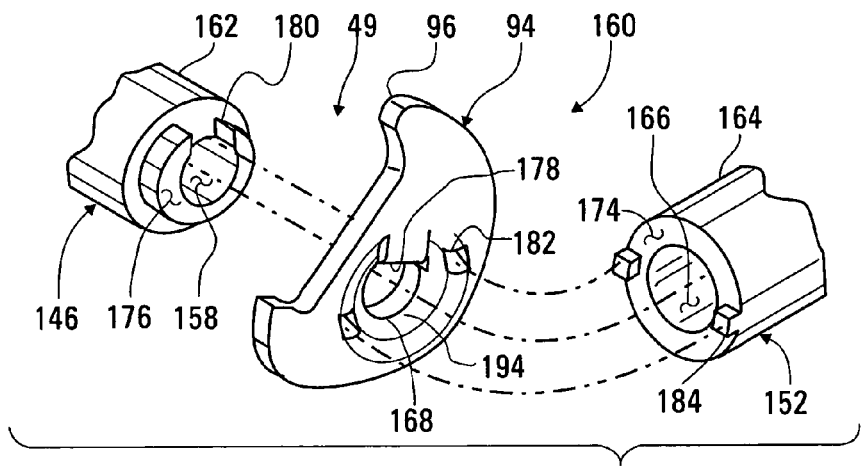
FIG. 9 is a perspective view of elements in the upper pivot shaft of FIG. 8 in an exploded relationship with one another.

FIG. 9 is a perspective view of the central portion 160 of the upper pivot shaft 49, showing the right end 162 of the first section 146 in an exploded relationship with the upper crank plate 94 and with the left end 164 of the sleeve 152. As the core pin 150 is inserted within the hole 166 of the sleeve 152, its cylindrical alignment portion 156 is inserted to extend through a hole 168 within the upper crank plate 94 into the hole 158 within the first section 146.

Figure 10:
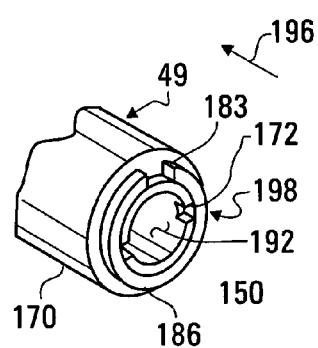
FIG. 10 a perspective view of the right end of a sleeve within the upper pivot shaft of FIG. 8.

FIG. 10 is a perspective view of a right end portion 170 of the upper pivot shaft 49, in which the core pin 150 is seen as including a slot 172 by which it is turned, with its threaded portion 153 in engagement with the threaded hole 154 within the first section 146, to clamp the upper crank plate 94 in place between the end face 174 of the sleeve 152 and the end face 176 of the first section 146.

The upper crank plate 94 includes a key tab 178 extending into a notch 180 within the first section 146 to ensure that the tooth 96 of the upper crank plate 94 remains in alignment with the tooth 54 of the upper lever 46 as the upper pivot shaft 49 is rotated. Thus, the upper crank plate is understood to have a coupling including an angular positioning element in the form of the tab 178, engaging the angular positioning element of the coupling at the first section 146, in the form of the notch 180. The upper crank plate 94 additionally includes a pair of slots 182, forming angular positioning elements, in which tabs 184, forming additional angular positioning elements, extending from the sleeve 152 are held. The sleeve 152 includes a notch 183, forming another angular positioning element, which engages a key tab 184 of the upper end crank plate 104, which is held in place on the right end face 186 of the sleeve 152 by means of a screw 188 extending into a threaded hole 190 and an alignment hole 192 of the core pin 150. Thus, while the core pin 150 is allowed to rotate in threaded engagement with the first section 146, as required to clamp the upper crank plate 94 in place, alignment features of the first section 146, the upper crank plate 94, the sleeve 152, and the end upper crank plate 104, hold the tooth 106 of the upper end crank plate 104 in alignment with the tooth 96 of the crank plate 94 and with the tooth 54 of the upper lever 52. Preferably, the end crank plate 104 and the crank plate 94 are identical parts.

If the electronic enclosure 10 is installed without the expansion unit 12, the end crank plate 104 and the screw 188 are preferably omitted, so that a space is provided within the cabinet 14 for another electronic enclosure to be installed immediately adjacent the enclosure 10, with a lever 46 having a tooth 54 engaging the slot 58 within the upper panel 40 that would otherwise be engaged by the tooth 106 of the end crank plate 104. Preferably, both the end crank plate 104 and the crank plate 94, being identical, include an central portion 194, offset to the left, in the direction of arrow 196, allowing the right end 198 of the upper pivot shaft 49 to be similarly offset from the tooth 106 of the end crank plate 104, so that an adjacently installed electronic enclosure will be spaced away from this shaft 49. However, the alignment and attachment features at the right end of the upper pivot shaft 49 remain available to provide for installation of an end crank plate 104 if an expansion unit 12 is added at to the free end 119 of the electronic enclosure at a later time.

Figure 11:
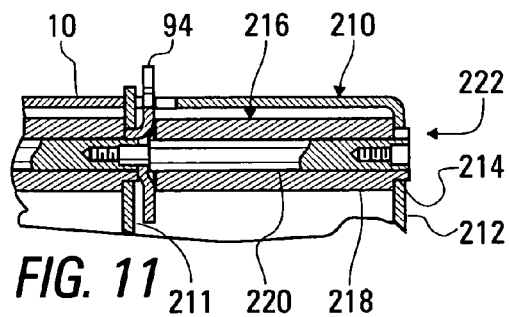
FIG. 11 is a fragmentary cross-sectional elevation of a first alternative expansion unit, built in accordance with the invention and attached to a free side of an electronic enclosure.

FIG. 11 is a fragmentary cross-sectional elevation of a first alternative expansion unit 210, attached to the free side 211 of the electronic enclosure 10. The first alternative expansion unit 210 has a cover 212 that includes a hole 214 in which an expansion shaft 216 is rotatably mounted. The expansion shaft 216 includes a sleeve 218 and a core pin 220, which are preferably is identical to the sleeve 152 and core pin 150, respectively, described above in reference to FIGS. 8-10. The core pin 220 replaces the screw 188 of FIG. 8, holding the upper end crank plate 94 in place and providing a right end 222 having features for mounting another upper end crank plate, either by means of another screw 188 or by means of another expansion shaft 216, in the event that an additional expansion unit is attached to extend farther to the right, opposite the direction of arrow 196.

An insertion and ejection mechanism built in accordance with the invention for use with an expansion unit attached to the latching side of an electronic enclosure will now be discussed, with particular reference being made to FIGS. 6, 12, and 13.

Figure 12:
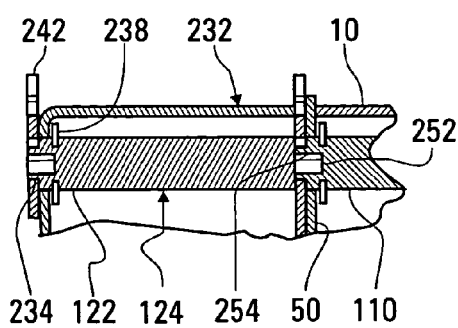
FIG. 12 is a fragmentary cross-sectional elevation of a second alternative expansion unit, built in accordance with the invention and attached to a latching side of an electronic enclosure.

FIG. 12 is a fragmentary cross-sectional elevation of a second alternative expansion unit 230, attached to the latching side 50 of the electronic enclosure 10 to extend outward therefrom in the direction of arrow. The second alternative expansion unit 230 has a cover 232 including a hole 234 in which the upper left extension shaft 124 is attached.

Figure 13:
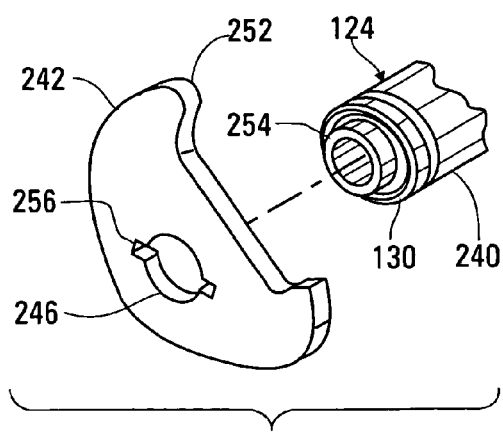
FIG. 13 is a perspective view of the left end of an extension shaft within the expansion unit of FIG. 12 in an exploded relationship with a crank plate therein.

FIG. 13 is a perspective view of the outer (left) end 240 of the upper left extension shaft 124 in an exploded relationship with an alternative crank plate 242, which is attached to the outer end 240 by projection welding a ring projection extending outward from the end 240 to an adjacent surface of the alternative crank plate 242, with a stud portion 244 of the shaft 124 extending within a hole 246 within the crank plate 242.

As shown in FIG. 6, the right end 122 of the upper left extension shaft 124 includes a pair of tabs 248, forming angular positioning element, that extend into slots 250 within the upper lever 46, which also form angular positioning elements. The extension shaft 236 is fastened to the cover 232 by means of a snap on retaining clip 238. When the second alternative expansion unit 230 is fastened to the latching end 50 of the electronic enclosure 10 with a stud portion 252 of the extension shaft 236 being driven into an alignment hole 254 of the upper pivot shaft 110, the alternative crank plate 242 is held in an orientation allowing the tabs 248 to enter the slots 250 with the tooth 252 of the alternative crank plate 242 in alignment with the tooth 54 of the upper lever 46. The alternative crank plate 242 additionally includes a pair of slots 256 aligned with the slots 250 of the upper lever 46 to provide for the installation of yet another expansion unit 230 to extend further outward in the direction of arrow 231.

While the configurations of upper pivot shafts and associated elements pivoted with the upper lever 46 have been explained in particular detail in reference to FIGS. 5-13, it is further understood that, in accordance with the invention, similar variations are additionally made to lower pivot shafts pivoted with the lower lever 44.

The cabinet 14 is of a flexible design, providing a number of spaces for simultaneously holding various types of electronic enclosures, such as the electronic enclosures 10, 112, both with and without expansion units 12, 232. The term "electronic enclosure" is understood to refer to either an electronic enclosure extending between a latching side and a free side, retaining a capability to have an expansion unit added to either or both the latching side and/or the free side, or an electronic enclosure including an expansion unit.

While the preceding discussion has described methods for attaching elements to one another so that tabs are located within notches or keyways to assure proper alignment between the slot-engaging teeth of the levers and cranks, it is understood that such elements may be omitted, with the various parts being manually aligned with one another as they are assembled and connected with mating threaded surfaces.

Figures 14, 15:
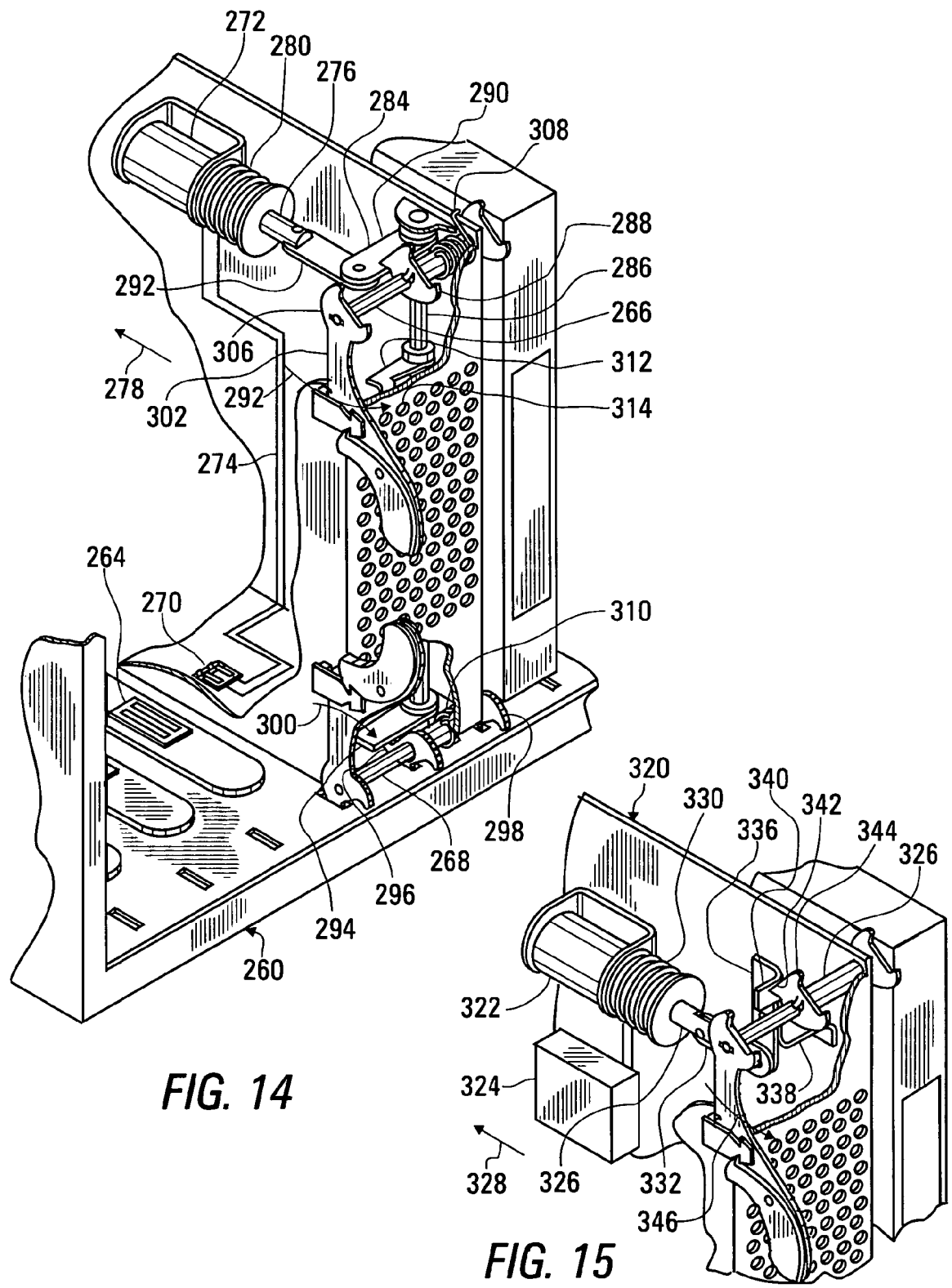
FIG. 14 is a fragmentary perspective view of a cabinet and an electronic enclosure, built in accordance with the invention to include a first version of an interlock mechanism.
FIG. 15 is a fragmentary perspective view of an electronic enclosure, built in accordance with the invention to include a second version of an interlock mechanism.

FIG. 14 is a fragmentary perspective view of a cabinet 260 and an electronic enclosure 262 built in accordance with a version of the invention to include a first version of an electrically operated interlocking mechanism, which selectively prevents the insertion or removal of the electronic enclosure 262 from the cabinet 260.

The cabinet 260 is generally like the cabinet 14, as described above in reference to FIGS. 1-4, except that the cabinet 260 includes means for determining when electronic enclosures may be inserted and removed and a number of contact structures 264 upon which a voltage is impressed upon determining that a time has been reached to allow the insertion and removal of electronic enclosures. In one implementation, a local cabinet management device controls the electronic locking mechanism. The logic for locking or unlocking may be present within the local cabinet management device or within a remote management device or system. Such a determination may be based on security concerns, with the insertion and removal of enclosures being allowed only during certain time periods or in response to providing a security key or password. Alternately, such a determination may be based on a determination that electrical power has been turned on or off in certain systems or blade servers, or that certain processes are not currently occurring, so that an electrical enclosure may be inserted or removed without causing damage to circuits or a loss of stored data.

The electronic enclosure 262 is generally like the electronic enclosure 10, as additionally described above in reference to FIGS. 1-4, except that an interlock mechanism, operating in response to the voltage applied to the contact structures 264 of the cabinet 260, is provided to selectively block the rotation of the upper pivot shaft 266 and of the lower pivot shaft 268 as required for the insertion or removal of the enclosure 264. For example, the electronic enclosure 262 is provided with a contact structure 270 making electrical contact with an underlying contact structure 264 of the cabinet 260, and with a solenoid 272 connected to the contact structure 264 by wires 274. The plunger 276 of the solenoid 272 is pulled to the rear, in the direction of arrow 278 when an electrical current is directed through the solenoid 272 by the wires 274, acting against a force supplied by a compression spring 280. The solenoid plunger 276 is connected by a link 282 to an upper interlocking crank 284, which is pivotally mounted within the enclosure 262 by attachment to a pivoting interlocking shaft 286. On the upper pivot shaft 286, an upper crank plate 288 includes a pawl portion 290 extending rearward above the upper interlocking crank 284 with the interlocking crank 284 held in its forward position by the compression spring 280, preventing rotation of the upper pivot shaft 286 in the direction of arrow 292, so that the upper crank plate is held in its locked position. Preferably, a lower interlocking crank 294 is additionally attached to the pivoting interlocking shaft 286 to extend above a pawl portion 296 of a lower crank plate 298 attached to the lower pivot shaft 268 when electrical power is not applied to the solenoid 272, preventing movement of the lower pivot shaft 268 from the locked position in which it is shown in the direction of arrow 300. Thus, the electronic enclosure 262 is held in the cabinet 260 with the pivot shafts 266 and 268 in their closed positions, as shown, since the upper lever 302 cannot be rotated in the direction of arrow 292, and additionally since the lower lever 304 cannot be rotated in the direction of arrow 300, until a voltage is applied to the contact structures 264 to operate the solenoid 272.

When the electronic enclosure 262 is being inserted into the cabinet 260, the levers 302, 304 must be held in their open positions, as shown in FIG. 1, before they can be moved into their closed positions. If an attempt is made to install the enclosure 262 with these levers in their closed positions, the teeth 306 of the levers 302, 304 and cam plates 290, 298 will prevent full insertion of the enclosure 262 into the cabinet 260. Preferably, the upper pivot shaft 266 is provided with a torque spring 308 exerting a torque opposite the direction of arrow 292, so that this shaft is held in its closed position with the electronic enclosure 262 removed from the cabinet 260, with this spring being strong enough to overcome the compression spring 280 as the pawl portion 290 of the upper crank plate 288 is rotated past the upper interlock lever 284 opposite the direction of arrow 292. Additionally, the lower pivot shaft 262 is preferably provided with a similar torque spring 310, so that this shaft 262 is also held in its closed position with the enclosure 262 removed from the cabinet 260. The contact structure 264 is then arranged to apply a voltage operating the solenoid 272 through the contact structure 270 before the enclosure 262 is fully installed, allowing the levers 302, 304 to be moved into their open position during the installation of the enclosure 262 at any time during which this voltage is present.

Thus, the interlocking mechanism of FIG. 14 selectively blocks the pivoting movement of the upper pivot shaft 266 and of the lower pivot shaft 268 from closed positions to open positions. The interlocking mechanism includes a first pawl surface of pawl portion 290 attached to the upper pivot shaft 266 and a second pawl surface of the pawl portion 296 attached to the lower pivot shaft 268. A first interlocking structure, in the form of interlocking crank 290, is held in a position blocking movement of the first pawl surface by the compression spring 280. Additionally, a second interlocking structure, in the form of interlocking crank 294, is held in a position blocking movement of the second pawl surface by the compression spring 280. The solenoid 272 moves both the first and second interlocking structures out of these positions blocking movements of pawl surfaces.

Electrical power may be placed on all of the contact structures 264 within the cabinet 260 so that any electronic enclosure 262 held within the cabinet 260 can be removed. In another version of the invention, electrical power is applied to one or more individual contact structures 264 so that only a certain electronic enclosure 262, or a certain group of electronic enclosures 262, can be removed. In this way, the ability to release individual electronic enclosures 262 can be controlled from a remote location.

Optionally, a release lever 312 is attached to the pivoting interlocking shaft 286 to provide for the manual rotation of the shaft 286 in the event of a power failure, with the lever 312 being pushed with a rod through a hole 314 in the electronic enclosure 10.

FIG. 15 is a fragmentary perspective view of an electronic enclosure 320 built in accordance with another version of the invention to include a second version of an interlocking mechanism, which selectively prevents the removal of the electronic enclosure 320 from the cabinet 14, discussed above in reference to FIGS. 1-4. The electronic enclosure is generally like the electronic enclosure 10, as additionally described above in reference to FIGS. 1-4, except that an interlock mechanism including a solenoid 322, operating in response to signal from a circuit 324 within the enclosure 320, is provided to selectively block the rotation of an upper pivot shaft 326, as required for the removal of the enclosure 320 from the cabinet 14. For example, the circuit 324 may provide a voltage to operate the solenoid 322 during times in which the removal of the enclosure 320 from the cabinet 14 may cause damage to components or a loss of stored data. A security feature may be implemented by operating the solenoid to block removal of the enclosure 320 until a certain time of day has been reached or until a predetermined password has been provided as an input to the management device or system.

The plunger 326 of the solenoid 322 is pulled to the rear, in the direction of arrow 328, when a voltage is applied to the solenoid 322. Otherwise, the plunger 326 is held forward, opposite the direction of arrow 328 by a compression spring 330. The plunger 326 is connected by a link 332 to an interlocking lever 336, which is pivotally mounted on a bracket 338. When the voltage is not applied to the solenoid 322, the upper surface 340 of the interlocking lever 336 is held away from a pawl portion 342 extending rearward as a part of the upper crank plate 344, allowing rotation of the upper pivot shaft 338 in the direction of arrow 346 for removal of the enclosure 320 from the cabinet 14. On the other hand, when the voltage is applied to the solenoid 322, the upper surface 340 of the interlocking lever 336 is moved under the pawl portion 342, preventing rotation of the upper pivot shaft 338 for removal of the enclosure 320 from the cabinet 14.

Thus, the interlocking mechanism of FIG. 14 selectively blocks the pivoting movement of the upper pivot shaft 326 from a closed position to an open position. This interlocking mechanism includes a pawl surface of pawl portion 342 and an interlocking structure, in the form of the interlocking lever 336 that is moved into position to block movement of the pawl portion by the solenoid 322, and that is otherwise held away from the pawl portion by the compression spring 330.

In accordance with the invention, an interlocking mechanism can be applied to selectively prevent pivoting movement of both the upper and lower pivot shafts, in the manner of FIG. 14, or to selectively prevent such movement of only one of these shafts, in the manner of FIG. 15. In either such interlocking mechanism, the prevention of such movement may occur in response to applying a voltage to a solenoid, or in response to not applying a voltage to a solenoid. While FIGS. 14 and 15 show pawl surfaces being formed as portions of crank plates, it is understood that a lever including a pawl surface can readily be added to a shaft, such as the upper shaft 110 of FIG. 5, not including a crank plate.

While the invention has been described in its preferred forms or embodiments with some degree of particularity, it is understood that this description has been given only by way of example, and that many variations in the arrangement of parts can be made without departing from the scope and spirit of the invention, as defined in the appended claims.

What is claimed is:

1. The Apparatus comprising:
an electronic enclosure having a latching side and a free side, opposite the latching side;
a first lever, pivotally mounted to be disposed along the latching side and to be movable between an open position and a closed position, wherein the first lever includes a first tooth moving outward from the electronic enclosure and forward along the electronic enclosure as the first lever is moved from the open position to the closed position; and
a first pivot shaft extending between the first lever and the free side, wherein the first pivot shaft is attached to the first lever to pivot with the first lever as the first lever is moved between the open position and the closed position; and wherein the first pivot shaft includes a first outer coupling surface including an angular positioning element, exposed at the free side and disposed at a first predetermined angle with respect to the first tooth, an expansion unit attached to extend outward from the free side, and
an outer end crank plate, including an inner coupling surface including an angular positioning element, removably attached to the first pivot shaft to be disposed along the free side of the enclosure and to pivot with the first lever as the first lever is moved between the open position and the closed position, wherein the outer end includes a first outer tooth aligned with the first tooth of the first lever by engagement between the inner coupling surface including an angular positioning element of the outer end crank plate and the first outer coupling surface including an angular positioning element of the first pivot shaft.

2. The apparatus of claim 1, wherein
the first pivot shaft includes a threaded hole extending from a surface of the first pivot shaft at the free side of the electronic enclosure, and
the outer end crank plate is removably attached to the first pivot shaft by means of a screw engaging the threaded hole.

3. The apparatus of claim 1, wherein the expansion unit includes:
a cover having an extension shaft mounting hole; and
an extension shaft mounted within the extension shaft mounting hole to pivot with the first pivot shaft having an outer coupling surface including an angular positioning element, exposed at a side of the expansion unit opposite the electronic enclosure and disposed at a first predetermined angle from the first tooth.

4. The apparatus of claim 3, wherein
the outer end crank plate additionally includes an outwardly directed outer coupling surface including an angular positioning element disposed at a first predetermined angle with respect to the inner coupling surface including an angular positioning element of the outer end crank plate, and
the extension shaft additionally includes an inner coupling surface including an angular positioning element engaging the outer coupling surface including an angular positioning element of the outer end crank plate to dispose the outer coupling surface including an angular positioning element of the extension shaft at the first predetermined angle from the first tooth.

5. The apparatus of claim 4, wherein
the first pivot shaft includes a threaded hole extending from a surface of the first pivot shaft at the free side of the electronic enclosure, and
the extension shaft includes a sleeve including the inner and outer coupling surfaces including angular positioning elements of the extension shaft, and a core pin, extending within the sleeve, having a threaded end engaging the threaded hole of the first pivot shaft and a threaded hole extending from an outer end of the core pin.

6. The Apparatus comprising:
an electronic enclosure having a latching side and a free side, opposite the latching side;
a first lever, pivotally mounted to be disposed along the latching side and to be movable between an open position and a closed position, wherein the first lever includes a first tooth moving outward from the electronic enclosure and forward along the electronic enclosure as the first lever is moved from the open position to the closed position; and a first pivot shaft extending between the first lever and the free side, wherein the first pivot shaft is attached to the first lever to pivot with the first lever as the first lever is moved between the open position and the closed position; and wherein the first pivot shaft includes a first outer coupling surface including an angular positioning element, exposed at the free side and disposed at a first predetermined angle with respect to the first tooth, wherein the first lever and the first pivot shaft form a first pivoting structure including a second outer coupling surface including an angular positioning element, exposed at the latching side and disposed at a second predetermined angle with respect to the first tooth.

7. The apparatus of claim 6, additionally comprising an expansion unit attached to extend outward from the latching side, wherein the expansion unit includes:

a cover having an extension shaft mounting hole, an extension shaft mounted within the extension shaft mounting hole to pivot with the first pivot shaft, having an inner coupling surface including an angular positioning element engaging the second outer coupling surface including an angular positioning element of the first pivoting structure, and an outer end crank plate, attached to pivot with the extension shaft, having an outer tooth aligned with the first tooth of the first lever by engagement between the inner coupling surface including an angular positioning element of the extension shaft and the outer coupling surface including an angular positioning element of the first pivoting structure.

8. The apparatus of claim 6, wherein the extension shaft and the outer end crank plate form a second pivoting structure including a third outer coupling surface including an angular positioning element, exposed at a side of the expansion unit opposite the electronic enclosure, and disposed at the second predetermined angle with respect to the first tooth.

9. Apparatus comprising:

an electronic enclosure having a latching side and a free side, opposite the latching side;

a first lever, pivotally mounted to be disposed along the latching side and to be movable between an open position and a closed position, wherein the first lever includes a first tooth moving outward from the electronic enclosure and forward along the electronic enclosure as the first lever is moved from the open position to the closed position; and a first pivot shaft extending between the first lever and the free side, wherein the first pivot shaft is attached to the first lever to pivot with the first lever as the first lever is moved between the open position and the closed position; and wherein the first pivot shaft includes a first outer coupling surface including an angular positioning element, exposed at the free side and disposed at a first predetermined angle with respect to the first tooth, and an intermediate crank plate mounted on the first pivot shaft between the latching side and the free side to pivot with the first lever as the first lever is moved between the open position and the closed position, including a second tooth outwardly exposed from the electronic enclosure in alignment with the first tooth of the first lever.

10. The apparatus of claim 9, wherein the first pivot shaft includes a first section, extending between the first lever and the intermediate crank plate, having a first intermediate coupling surface including an angular positioning element and a second section, extending between the intermediate crank plate and the free side of the electronic enclosure, having a second intermediate coupling surface including an angular positioning element, and the intermediate crank plate includes a third intermediate coupling surface including an angular positioning element, engaging the first intermediate coupling surface including an angular positioning element to hold the second tooth in alignment with the first tooth and a fourth intermediate coupling surface including an angular positioning element engaging the second intermediate coupling surface including an angular positioning element to hold the first outer coupling surface including an angular positioning element to be disposed at the first predetermined angle with respect to the first tooth.

11. The apparatus of claim 10, wherein the first section of the first pivot shaft includes a threaded hole extending from an end surface of the first pivot shaft adjacent the intermediate crank plate, and the second section of the first pivot shaft includes a sleeve including the second intermediate coupling surface including an angular positioning element and the first outer coupling surface including an angular positioning element, and a core pin, extending within the sleeve, having a threaded end, engaging the threaded hole of the first section, and a threaded hole extending at the free side of the electronic enclosure.

12. Apparatus comprising:

an electronic enclosure having a latching side and a free side, opposite the latching side;

a first lever, pivotally mounted to be disposed along the latching side and to be movable between an open position and a closed position, wherein the first lever includes a first tooth moving outward from the electronic enclosure and forward along the electronic enclosure as the first lever is moved from the open position to the closed position; a first pivot shaft extending between the first lever and the free side, wherein the first pivot shaft is attached to the first lever to pivot with the first lever as the first lever is moved between the open position and the closed position; and wherein the first pivot shaft includes a first outer coupling surface including an angular positioning element, exposed at the free side and disposed at a first predetermined angle with respect to the first tooth, and an interlocking mechanism electrically operated to selectively block pivoting movement of the first pivot shaft from the closed position to the open position.

13. The apparatus of claim 12, additionally comprising a pawl surface attached to the first pivot shaft, wherein the interlocking mechanism includes an interlocking structure movably mounted adjacent the pawl surface, a spring holding the interlocking structure in a position blocking movement of the pawl surface, and a solenoid moving the interlocking structure away from the pawl surface to allow movement of the pawl surface.

14. The apparatus of claim 13, wherein the interlocking mechanism additionally includes a contact structure extending outward from the electronic enclosure to provide electrical power for the solenoid.

15. The apparatus of claim 12, additionally comprising a pawl surface attached to the first pivot shaft, wherein the interlocking mechanism includes an interlocking structure movably mounted adjacent the pawl surface, a solenoid holding the interlocking structure in a position blocking movement of the pawl surface, and a spring moving the interlocking structure away from the pawl surface to allow movement of the pawl surface.

16. The apparatus of claim 13, wherein the interlocking mechanism additionally includes a first contact structure extending outward from the second electronic enclosure to provide electrical power for the solenoid.

17. The apparatus of claim 12, wherein
the second electronic enclosure additionally comprises a pawl surface attached to the first pivot shaft, and
the interlocking mechanism includes an interlocking structure movably mounted adjacent the pawl surface, a solenoid holding the interlocking structure in a position blocking movement of the pawl surface, and a spring moving the interlocking structure away from the pawl surface to allow movement of the pawl surface.

18. Apparatus comprising:
an electronic enclosure having a latching side and a free side, opposite the latching side;
a first lever, pivotally mounted to be disposed along the latching side and to be movable between an open position and a closed position, wherein the first lever includes a first tooth moving outward from the electronic enclosure and forward along the electronic enclosure as the first lever is moved from the open position to the closed position; and
a first pivot shaft extending between the first lever and the free side, wherein the first pivot shaft is attached to the first lever to pivot with the first lever; and wherein the first pivot shaft includes a first outer coupling surface including an angular positioning element, exposed at the free side and disposed at a first predetermined angle with respect to the first tooth wherein the first pivot shaft extends within the electronic enclosure adjacent an upper front edge of the electronic enclosure, and wherein the first tooth moves upward from the electronic enclosure and forward along the electronic enclosure as the first lever is moved from the open position to the closed position; and a second lever pivotally mounted to be disposed along the latching side, to extend within the electronic enclosure, adjacent a lower front edge of the electronic enclosure, and to be movable between an open position and a closed position, wherein the second lever includes a second tooth moving downward from the electronic enclosure and forward along the electronic enclosure as the second lever is moved from the open position to the closed position, and a second pivot shaft extending between the second lever and the free side, wherein the second pivot shaft is attached to the second lever to pivot with the second lever; and wherein the second pivot shaft includes a first outer coupling surface including an angular positioning element, exposed at the free side and disposed at a first predetermined angle with respect to the second tooth.

19. The apparatus of claim 18, additionally comprising an interlocking mechanism electrically operated to selectively block pivoting movement of the first pivot shaft from its closed position to its open position and to selectively block pivoting movement of the second pivot shaft from its closed position to its open position.

20. The apparatus of claim 19, additionally comprising a first pawl surface is attached to the first pivot shaft and a second pawl surface is attached to the second pivot shaft, wherein the interlocking mechanism includes a first interlocking structure movably mounted adjacent the first pawl surface, a second interlocking structure movably mounted adjacent the second pawl surface, a spring holding the interlocking structure in a position blocking movement of the first and second pawl surfaces, and a solenoid moving the first and second interlocking structures away from the first and second pawl surfaces to allow movement of the first and second pawl surfaces.

21. The apparatus of claim 20, wherein the interlocking mechanism additionally includes a contact structure extending outward from the electronic enclosure to provide electrical power for the solenoid.

22. The apparatus of claim 19, additionally comprising a first pawl surface is attached to the first pivot shaft and a second pawl surface is attached to the second pivot shaft, wherein the interlocking mechanism includes a first interlocking structure movably mounted adjacent the first pawl surface, a second interlocking structure movably mounted adjacent the second pawl surface, a solenoid holding the interlocking structure in a position blocking movement of the first and second pawl surfaces, and a spring holding the first and second interlocking structures away from the first and second pawl surfaces to allow movement of the first and second pawl surfaces.

* * * * *